United States Patent [19]
Noguchi et al.

[11] Patent Number: 5,705,828
[45] Date of Patent: Jan. 6, 1998

[54] PHOTOVOLTAIC DEVICE

[75] Inventors: Shigeru Noguchi, Hirakata; Hiroshi Iwata, Neyagawa; Keiichi Sano, Takatsuki, all of Japan

[73] Assignee: Sanyo Electric Co., Ltd., Osaka, Japan

[21] Appl. No.: 544,956

[22] Filed: Feb. 20, 1996

Related U.S. Application Data

[63] Continuation-in-part of Ser. No. 957,437, Oct. 6, 1992, abandoned, which is a continuation-in-part of Ser. No. 757,250, Sep. 10, 1991, Pat. No. 5,213,628.

[30] Foreign Application Priority Data

Aug. 10, 1991 [JP] Japan ..................... 8-260746

[51] Int. Cl.$^6$ .................. H01L 29/04; H01L 31/036; H01L 31/0376
[52] U.S. Cl. .................. 257/53; 257/52; 257/59; 257/72
[58] Field of Search ................ 257/53, 458, 59, 257/72, 52

[56] References Cited

U.S. PATENT DOCUMENTS

| | | | |
|---|---|---|---|
| 4,363,828 | 12/1982 | Brodsky et al. | 427/39 |
| 4,514,582 | 4/1985 | Tiedje et al. | 257/53 |
| 4,737,196 | 4/1988 | Yukimoto | 257/53 |
| 5,066,340 | 11/1991 | Iwamoto et al. | 257/53 |
| 5,140,397 | 8/1992 | Haga et al. | 757/53 |

FOREIGN PATENT DOCUMENTS

| | | | |
|---|---|---|---|
| 2310353 | 4/1989 | European Pat. Off. | 257/53 |
| 1-194370 | 8/1989 | Japan | 257/53 |

OTHER PUBLICATIONS

R. A. Arndt, et al., "Optical Properties of the COMSAT Non-Reflective Cell", 11th IEEE Photovoltaic Specialists Conference, Arizona, 1975.

M. Taguchi, et al., "Improvement of the Conversion Efficiency of Polycrystalline Silicon Thin Film Solar Cell", 5th International Photovoltaic Science and Engineering Conference, Kyoto, Japan, Nov. 26–30, 1990.

K. Wakisaka, et al., "More Than 16% Solar Cells..." 22nd IEEE Photovoltaic Specialists Conference, Las Vegas, USA, Oct. 7–11, 1991.

Primary Examiner—Mahshid D. Saadat
Assistant Examiner—S. V. Clark
Attorney, Agent, or Firm—Loeb & Loeb LLP

[57] ABSTRACT

The disclosure relates to a photovoltaic device comprising a transparent electrode, one conductive type amorphous semiconductor, another conductive type crystal semiconductor, an intrinsic amorphous semiconductor, another conductive type amorphous semiconductor and a metal electrode and having a first semiconductor junction composed of the one conductive type amorphous semiconductor and the another conductive type crystal semiconductor, and a second semiconductor junction composed of the another type crystal semiconductor and the another conductive type amorphous semiconductor, wherein the transparent electrode is located on light incident side of the one conductive type amorphous semiconductor, the metal electrode is located on another side, the intrinsic amorphous semiconductor is located between the another conductive type crystal semiconductor and the another conductive type amorphous semiconductor, the first semiconductor junction is located on the light incident side, and the second semiconductor junction is located on the another side. In the device, the crystal semiconductor is composed single-crystalline semiconductor or polycrystalline semiconductor.

9 Claims, 8 Drawing Sheets

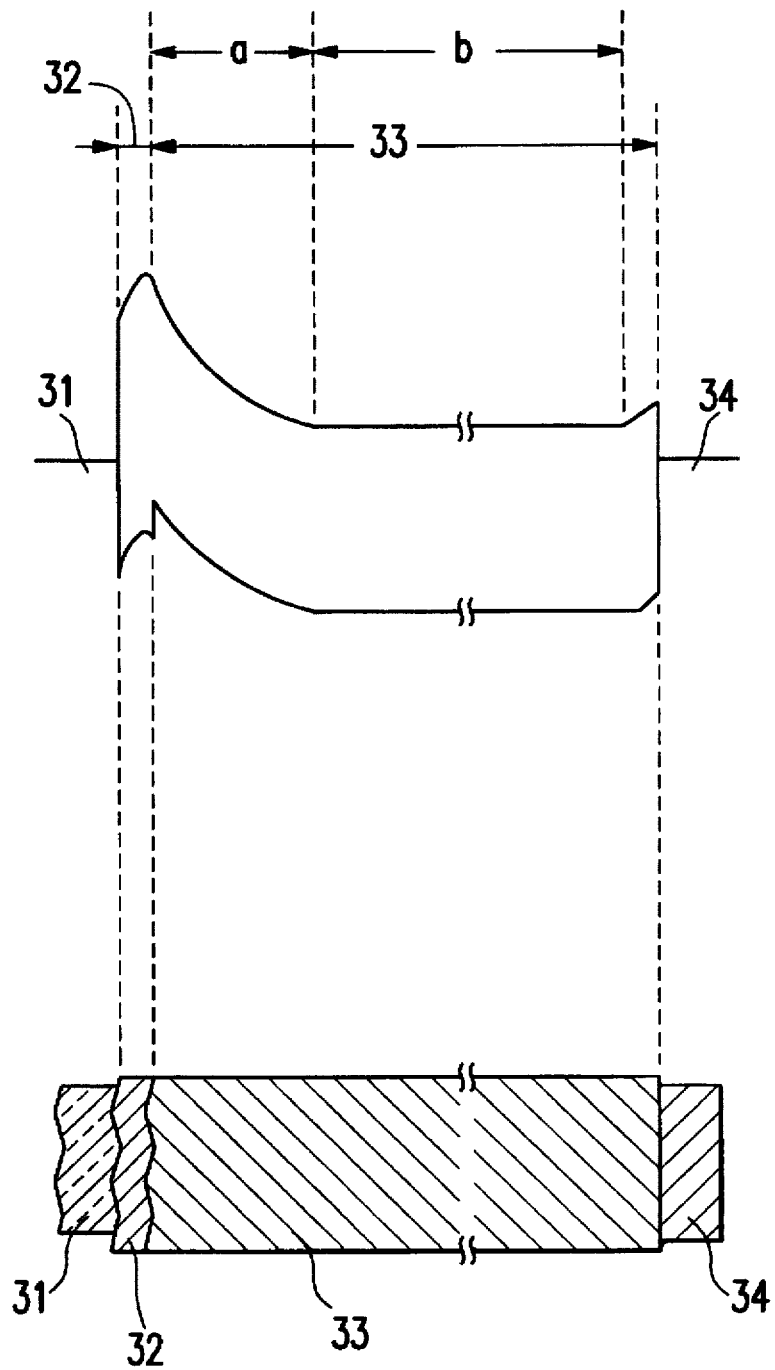

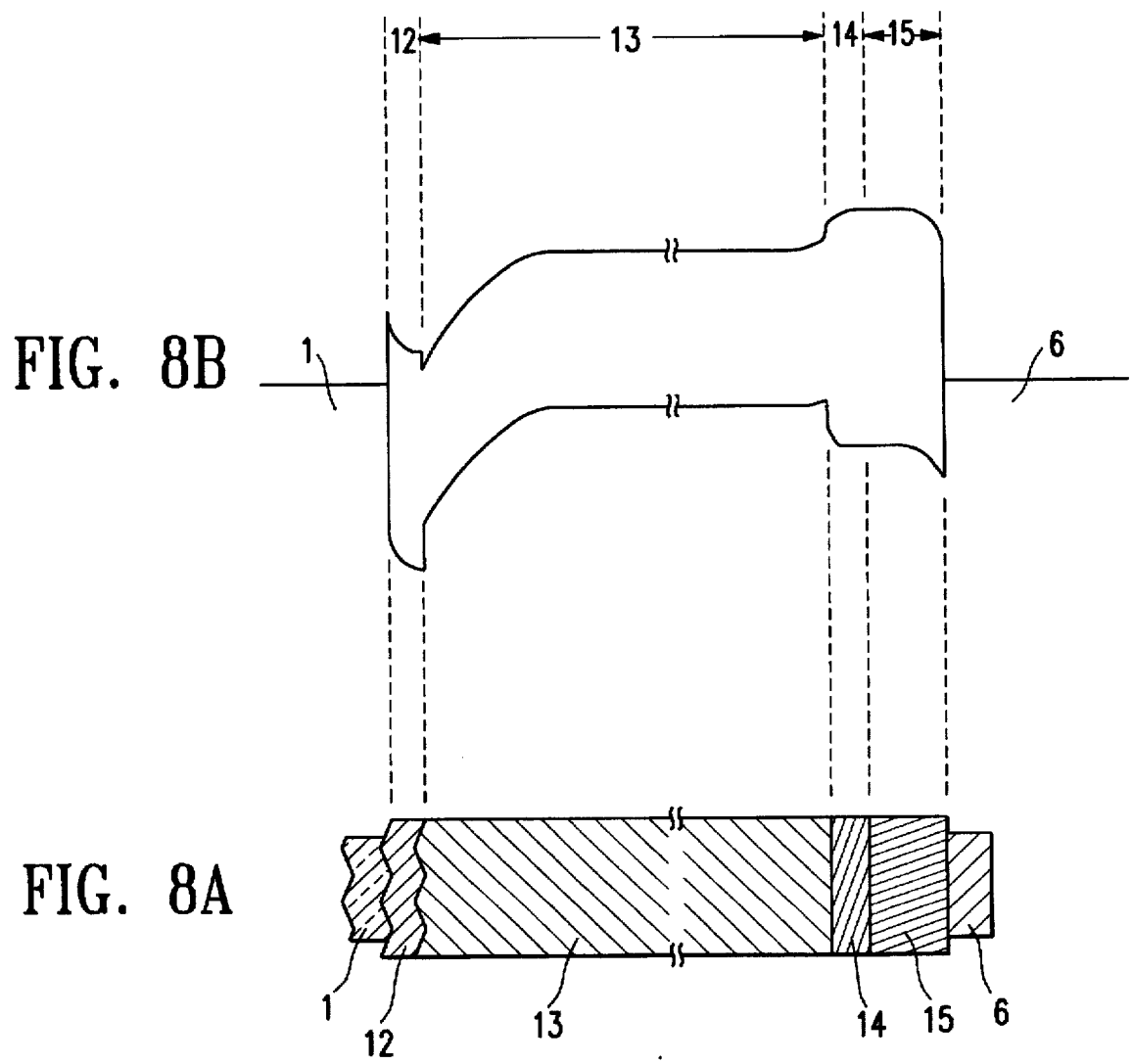

PHOTOVOLTAIC DEVICE

CROSS-REFERENCE TO RELATED APPLICATIONS

This is a Continuation-in-Part of application Ser. No. 07/957,437, filed Oct. 6, 1992, now abandoned, which is a continuation-in-part of application Ser. No. 07/757,250, filed Sep. 10, 1991, now U.S. Pat. No. 5,213,628.

BACKGROUND OF THE INVENTION

1. Field of the Invention

This invention relates to photovoltaic devices having semiconductor junction comprised of an amorphous semiconductor and a single-crystalline semiconductor or a polycrystalline semiconductor.

2. Description of the Prior Art

In those days, the devices composed of thin layer semiconductors are energetically being developed.

In the devices the semiconductors are used as thin layer states, thus materials whose crystal state of the semiconductor is basically amorphous or polycrystal are used. Based on a reason, as it is no need to use an orderly structure like a single crystalline structure, it is easy to manufacture large scale devices. Thus basic conditions for photovoltaic devices such as solar cells are fully satisfied.

However, as crystal structures of these semiconductors are disordered, the semiconductors have many dangling bonds in their crystal structures. Therefore, these materials are not good materials for photovoltaic devices compared to single-crystalline material.

Recently, to solve the above mentioned problems, a photovoltaic device having a photosensitive layer composed of amorphous semiconductors and crystal semiconductors is proposed. FIG. 1A is a side elevation view, in cross section, of the photovoltaic device of a first prior art, which is composed of single crystalline semiconductors and amorphous semiconductors. FIG. 1B is a band profile of the photovoltaic device shown in FIG. 1A.

In this specification, the band profiles in accordance with the present invention and the prior art are diagramed in consideration of characters of devices, are not proved. The band profiles are used for easy explanation.

In FIG. 1A, 31 is a transparent electrode placed on a light incidence side of this photovoltaic device, 32 is an amorphous semiconductor comprising p-type amorphous silicon (the amorphous silicon is hereafter a-Si), 33 is a crystal semiconductor comprising n-type single-crystalline silicon and 34 is a metal back electrode. In this photovoltaic device, one semiconductor junction is formed between the amorphous semiconductor 32 and the crystal semiconductor 33 (single-crystalline silicon).

A surface of the light incident side of the single-crystalline silicon 33 is manufactured to form an uneven surface so that a loss of incident light reflected in there lowers.

The manufacturing process of this method is to etch the surface of the single-crystalline silicon by exposing to solution of NaOH whose concentration is 0.25 mol/l and whose temperature is at 85° C. and by exposing to isopropyl alcohol, the desired uneven surface is easily obtained.

The same treatments for the uneven surface are carried for both the present invention and comparative examples below.

According to the band profile shown in FIG. 1B, this photovoltaic device can generate photocurrent to separate incident light into electrons and holes by operation of the internal electric field (a large band bending) formed by the p-type a-Si 32 and the n-type single-crystalline silicon 33.

As to photo-generated carriers in this portion, movement by both drift based on internal electric field and diffusion contribute to the photo-generated carriers. As a result, photocurrent can be picked up to outside efficiently. Indeed, the movement by drift contributes to the carrier movement in this portion.

Then, a bulk portion of the single-crystalline silicon, such as (b) shown in FIG. 1B, has no the band bending and has no internal electric field. Accordingly, in this portion the movement of the photo-generated carriers by drift is not observed, only the movement of the photo-generated carriers by diffusion is observed. Thus it is difficult to pick up the photo-generated carriers to the outside of the photovoltaic device.

Indeed, in the case of the movement by diffusion, the movement of the photo-generated carriers is observed that the electrons and the holes both equally flow to a direction of both the transparent electrode 31 and the back electrode 34. Therefore, in the back electrode 34, much recombination of the photo-generated carriers take place.

Then to solve this problem, a photovoltaic device of a second prior art is described in "TAIYOUKOUHATUDEN" (p396–p398, 1980 MORIKITASHUPPAN). This photovoltaic device has a BSF (back surface field) structure and differs from the device of FIG. 1 by the inclusion of a highly doped crystalline layer between silicon 33 and back electrode 34, such highly doped crystalline layer usually being formed by thermal diffusion.

However, there still exists a need for improvements in the prior art photovoltaic devices having a BSF structure including a highly doped crystalline semiconductor layer adjacent the back electrode.

SUMMARY OF THE INVENTION

Accordingly, a primary object of the present invention is to provide photovoltaic devices having superior characteristics in comparison with prior art photovoltaic devices having a BSF structure including a highly doped crystalline semiconductor layer.

Another object of the present invention is to increase the number of the photo-generated carrier which can be picked up to outside of the photovoltaic device.

Still another object of the present invention is to absorb the long wavelength light in another side effectively which is not absorbed in the light incident side in the photo-generated carrier area.

Still another object of the present invention is to provide a photovoltaic device having superior to conversion efficiency.

The above and other objects are fulfilled by a photovoltaic device comprising, in sequence and in the order stated, a transparent front electrode, an amorphous semiconductor layer of a first conductivity type, a crystalline semiconductor layer of a second conductivity type opposite to the first conductivity type, an amorphous semiconductor layer of the second conductivity type and a metal back electrode, these components being laminated together.

The above objects are additionally fulfilled by a photovoltaic device comprising a transparent electrode, one conductive type amorphous semiconductor, another conductive type crystal semiconductor, an intrinsic amorphous semiconductor, another conductive type amorphous semiconductor and a metal electrode and having: a first semiconductor junction composed of said one conductive type amorphous semiconductor and said another conductive type crystal semiconductor, and a second semiconductor junction composed of said another type crystal semiconductor and said another conductive type amorphous semiconductor, wherein said transparent electrode is located on light incident side of said one conductive type amorphous semiconductor, said metal electrode is located on another side of said one conductive type amorphous semiconductor, said intrinsic amorphous semiconductor is located between said another conductive type crystal semiconductor and said another conductive type amorphous semiconductor, said first semiconductor junction is located on said light incident side, and said second semiconductor junction is located on said another side.

The above objects are also fulfilled by a photovoltaic device comprising a transparent electrode, one conductive type amorphous semiconductor, an i-type amorphous semiconductor layer, another conductive type crystal semiconductor, an intrinsic amorphous semiconductor, another conductive type amorphous semiconductor and a metal electrode and having a first semiconductor junction composed of said one conductive type amorphous semiconductor and said another conductive type crystal semiconductor, and a second semiconductor junction composed of said another type crystal semiconductor and said another conductive type amorphous semiconductor, wherein said i-type amorphous semiconductor is placed between said one conductive type amorphous semiconductor and said another conductive type crystal semiconductor, said transparent electrode is located on light incident side of said one conductive type amorphous semiconductor, said metal electrode is located on another side of said one conductive type amorphous semiconductor, said intrinsic amorphous semiconductor is located between said another conductive type crystal semiconductor and said another conductive type amorphous semiconductor, said first semiconductor junction is located on said light incident side, and said second semiconductor junction is located on said another side.

Further, the above objects are fulfilled by a photovoltaic device comprising a first amorphous semiconductor layer located on a light incident side, a second amorphous semiconductor layer located on another side, a crystal semiconductor layer and an intrinsic amorphous semiconductor layer placed between said first amorphous semiconductor layer and said second amorphous layer and having: a transparent electrode located on said light incident side of said first amorphous semiconductor layer, and a metal electrode located on said another side of said second amorphous semiconductor layer, wherein long wavelength light which is not absorbed in said light incident side of said crystal semiconductor layer and which pass through said light incident side is absorbed in said another side and near said intrinsic amorphous semiconductor layer and photocurrent is generated between said transparent electrode and the metal electrode.

In the device, the crystal semiconductor is selected from the group of single-crystalline semiconductor and polycrystalline semiconductor.

The intrinsic semiconductor is suitable to have a hydrogen content in a range from 7 atm % to 29 atom %, and to have a thickness of in the range from 20 Å to 400 Å.

Further the surface of the crystal semiconductor of the light incident side is formed uneven.

The foregoing objects are fulfilled by the above structures for the following reasons.

The photovoltaic device of the present invention has two semiconductor junctions comprising first semiconductor junction and second semiconductor junction. The second semiconductor junction is formed by the intrinsic amorphous semiconductor including the hydrogen between the crystal semiconductor and the other amorphous semiconductor, and the conductive type of the crystal semiconductor is the same as that of the other amorphous semiconductor. The recombination of photo-generated carrier can be decreased by this second semiconductor junction on a region of the second semiconductor junction. Accordingly, the number of the photo-generated carrier which can be pick up to outside of the photovoltaic device is increased.

In other words, as the intrinsic amorphous semiconductor whose quality of the layer is good, is formed between the conductive crystal semiconductor and the conductive amorphous semiconductor, the recombination of the photo-generated carrier is prevented.

Indeed, as the intrinsic amorphous semiconductor whose hydrogen content is in the range from 7 atm % to 29 atm % is used, on a manufacturing of the device, this hydrogen compensate for dangling bonds of the interface state, and the hydrogen also compensate for the dangling bonds formed among the grains of the polycrystalline semiconductor. Accordingly, it becomes to pick up the photo-generated carrier easily to outside.

BRIEF DESCRIPTION OF THE DRAWING

These and other objects, advantages and features of the invention will become apparent from the following description thereof taken in conjunction with the accompanying drawings which illustrate specific embodiments of the invention. In the drawings:

FIG. 1A is a side elevation view, in cross section, of a photovoltaic device in accordance with a first prior art, FIG. 1B is a band profile of the photovoltaic device shown in FIG. 1A.

FIG. 8A is a side elevation view, in cross section, of a photovoltaic device in accordance with a sixth embodiment, FIG. 8B is a band profile of the photovoltaic device shown in FIG. 8A.

DETAILED DESCRIPTION OF THE PREFERRED EMBODIMENT

First Embodiment

Figures 2A, 2B:
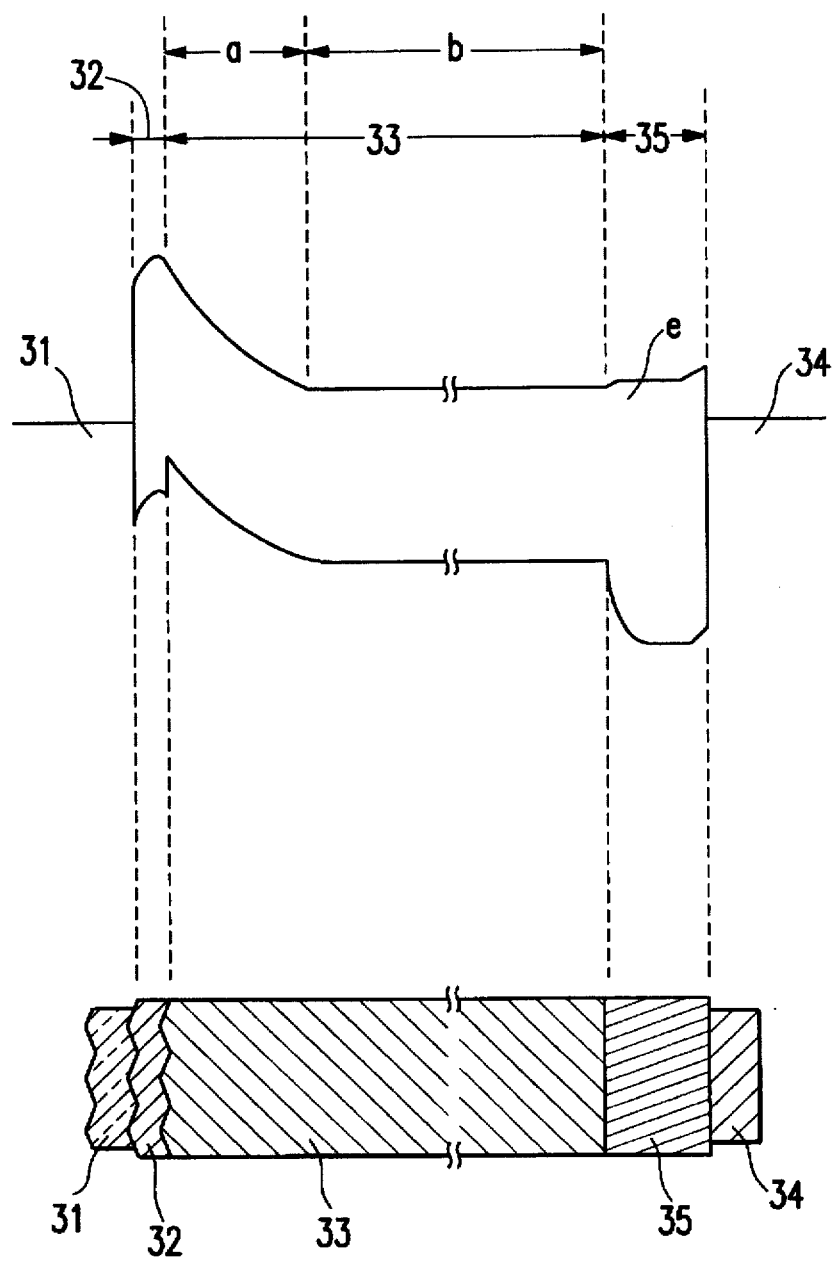
FIG. 2A is a side elevation view, in cross section, of a photovoltaic device in accordance with a first embodiment of the invention.
FIG. 2B is a band profile of the photovoltaic device shown in FIG. 2A.

A first embodiment is shown in FIGS. 2A and 2B, in which components identical to those of FIGS. 1A and 1B are identified by the same reference numerals.

In this photovoltaic device, to prevent from recombining of the photo-generated carrier in the back electrode by diffusion from above mentioned bulk (b), the n-type amorphous semiconductor 35 is formed between the single-crystalline silicon 33 and the back electrode 34. This n-type amorphous semiconductor 35 is made of a-Si, and a band gap size of this n-type a-Si 35 is different from that of the single-crystalline silicon 33.

Accordingly in this embodiment of the photovoltaic device, a first semiconductor junction is formed between the amorphous semiconductor 32 and the single-crystalline silicon 33, and a second semiconductor junction is formed between the singlecrystalline silicon 33 and the a-Si 35.

Based on above structure of the photovoltaic device, as to the photo-generated carrier is present in a deep portion viewing from the light incident side, the holes are prevented from diffusing by a portion (d) protruded from valence band in the a-Si 35. The other hand, even using the a-Si 35, the electrons are not blocked by a portion (e) protruded to the conduction band. Accordingly, it is easy to diffuse to the back electrode and pick up the electrons to outside of the photovoltaic device.

The structure of forming the n-type a-Si 35 shown in FIG. 2B is effective to decrease the recombination of the photo-generated carrier in the back electrode 34. But the structure formed by the n-type a-Si 35 between the n-type singlecrystalline silicon 33 and the back electrode 34 is to form new junction between the n-type single-crystalline silicon 33 and the n-type a-Si 35.

This new junction is formed between different crystal structures, and is normally distinguished from the junction formed by between crystal semiconductors and formed by between amorphous semiconductors. Therefore, many levels of the junction are generated by mismatch of the crystal structures.

Further, in general, for amorphous semiconductors, quality of the layer is reduced by doping of dopant. In this way, in the semiconductor junction using amorphous semiconductor including the dopant (shown as the n-type a-Si 35 in the above embodiment), the number of the interface state are increased according to the dopant, and the number of recombination of photo-generated carriers are increased.

One significant advantage of this embodiment is that it's BSF structure can be formed at lower temperatures than prior art BSF structures which are formed by thermal diffusion. Specifically, in the first embodiment, amorphous layer 35 can be formed at a low temperature in the range of 120°–180° C., as illustrated in TABLE 1, below.

Second Embodiment

Figure 3B:
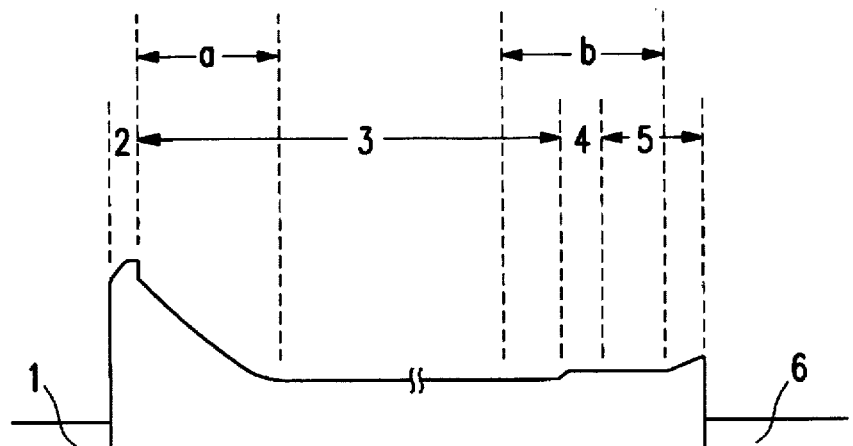
FIG. 3B is a band profile of the photovoltaic device shown in FIG. 3A.
Figure 3A:
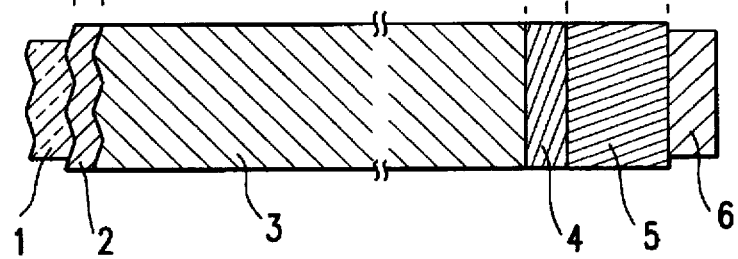
FIG. 3A is a side elevation view, in cross section, of a photovoltaic device in accordance with a second embodiment of the present invention.

FIG. 3A is a side elevation view, in cross section, of the photovoltaic device in accordance with the present invention. And FIG. 3B is the band profile to show the internal electric field and to explain principle of the photovoltaic device.

In FIG. 3A, 1 is a transparent electrode composed of indium tin oxide, tin oxide or zinc oxide, 2 is a p-type amorphous semiconductor comprising an a-Si whose thickness is in the range from 30 Å to 200 Å, 3 is a crystal semiconductor comprising a n-type single-crystalline silicon whose thickness of the layer is in the range from 50 μm to 700 μm, 4 is an intrinsic amorphous semiconductor of the feature of the present invention comprising an i-type a-Si involving the hydrogen, 5 is a n-type amorphous semiconductor comprising a n-type a-Si whose thickness of the layer is in the range from 50 Å to 1000 Å, 6 is a back electrode composed of aluminum, silver or titanium.

In the photovoltaic device of this embodiment, the first semiconductor junction is formed by the p-type amorphous semiconductor 2 and the n-type single-crystalline semiconductor 3. The intrinsic amorphous semiconductor 4 is placed between the n-type single-crystalline semiconductor 3 and the n-type amorphous semiconductor 5, and the second semiconductor junction is composed of the n-type single-crystalline semiconductor 3, intrinsic amorphous semiconductor 4 and the n-type amorphous semiconductor.

In this second embodiment, as to a common material composed of the first semiconductor junction and the second semiconductor junction, the single-crystalline silicon is indicated, however, a polycrystalline semiconductor (for example; a polycrystalline silicon) can be used as the material to form these junction, and the same effect can be expected.

Further, the materials of the p-type a-Si 2, the n-type single-crystalline silicon 3 and the n-type a-Si 5 which are well known is used in the first embodiment.

Typical forming conditions of the semiconductors 2, 4 and 5 by plasma CVD is shown in table 1.

TABLE 1

| a-Si | p-type(No.2) | n-type(No.5) | i-type(No.4) |
|---|---|---|---|
| Amount of the gas | | | |
| SiH₄ | 5 | 10 | 5 |
| B₂H₆ (1%) | 3–30 | — | — |
| PH₃ (1%) | — | 20 | — |
| H₂ | 0–70 | — | 0–100 |
| Substrate temperature (°C.) | 120–180 | 120–180 | 120–270 |
| Discharge gas pressure (Pa) | 15–27 | 8–27 | 5–27 |
| Discharge power (mW/cm²) | 25–75 | 55 | 25–75 |

In the table 1, the $Ba_2H_6$ gas and the $PH_3$ gas are diluted with the hydrogen gas, and the concentration of each gas is set to be 1% and 2%, respectively. And as to the intrinsic semiconductor 4 formed according to the condition shown in table 1, hydrogen content of the a-Si is in the range from 7 atm % to atm %.

In this embodiment, although the intrinsic a-Si is used the intrinsic amorphous semiconductor 4, a-Si carbide, a-Si germanium or a-Si nitride can be used.

To form these semiconductor layers by plasma CVD, in the case of the a-Si carbide both silane gas ($SiH_4$) and methane gas ($CH_4$), in the case of the a-Si germanium both the silane gas ($SiH_4$) and the germane gas ($GeH_4$) and in the case of the a-Si nitride both the silane gas ($SiH_4$) and the ammonia gas ($NH_3$) are used, respectively.

A state of the internal electric field of this photovoltaic device of the present invention is explained with the band profile shown in FIG. 3B. There are the large internal electric field (a) formed by both the p-type amorphous semiconductor 2 and the single-crystalline semiconductor 3 on the light incident side and the comparative small internal electric field (b) formed by among the single-crystalline semiconductor 3, the intrinsic semiconductor 4 and the n-type amorphous semiconductor 5. The intrinsic semiconductor 4 is placed between the singlecrystalline semiconductor 3 and the n-type amorphous semiconductor 5. The portion of the internal electric field (b) is constructed by the BSF structure.

Though the interface state is generated when the single-crystalline semiconductor 3 is directly contacted with the n-type amorphous semiconductor, in this Photovoltaic device having the intrinsic amorphous semiconductor 4, the interface state is drastically decreased.

Figure 4:
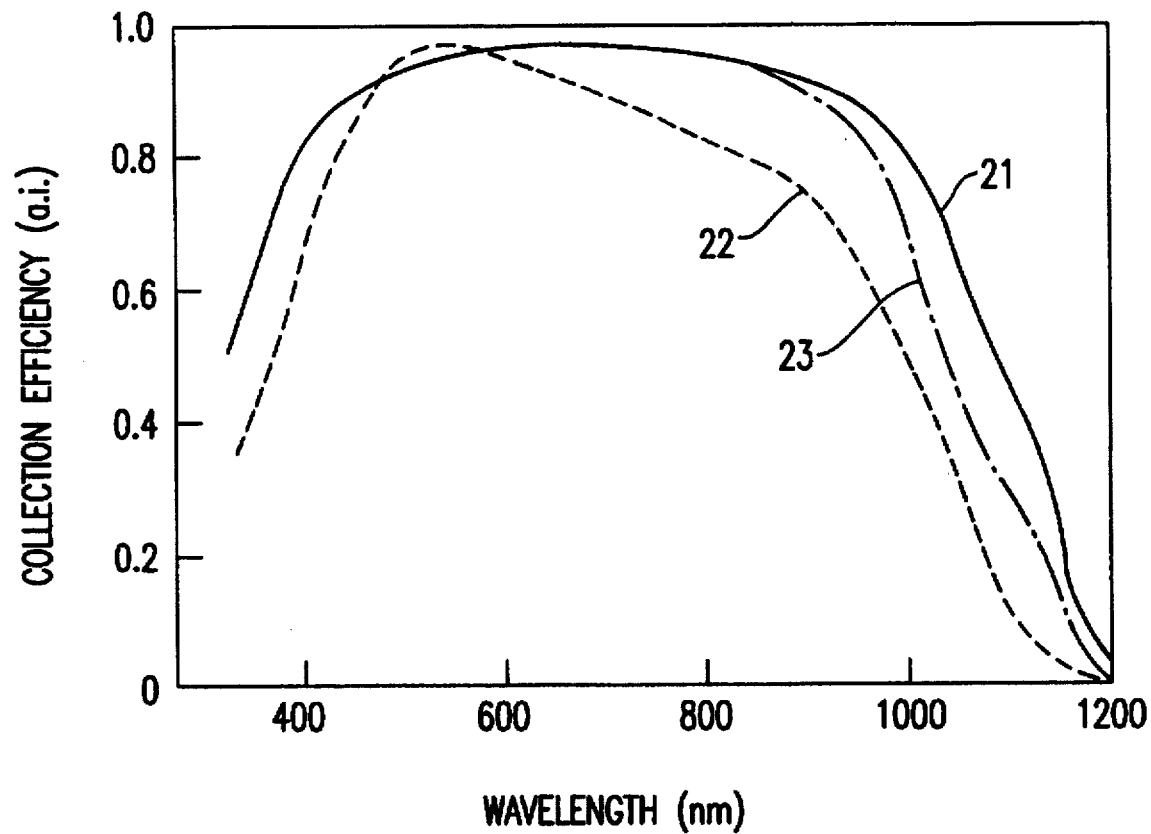
FIG. 4 is a graph showing the relationship between wave length of light and photo-sensitivity.

On manufacturing the photovoltaic device, the surface of the light incident side of the single-crystalline semiconductor is formed uneven to decrease the reflect light. In this embodiment, the uneven height of the surface is in the range from 1 µm to 10 µm. The photo-sensitivity is measured on the photovoltaic device in accordance with the second embodiment and the prior art. This result is shown in FIG. 4. FIG. 4 is a spectral atlas of light for the photovoltaic device, and is showing the relationship between wavelength of light and photo-sensitivity. In FIG. 4, 21 is a characteristic of the photovoltaic device of the present invention, and 22 is a characteristics of the photovoltaic device of the prior art. The photovoltaic device 22 of the prior art, compared to the photovoltaic device 21 of the present invention, does not have the intrinsic amorphous semiconductor 4 or the highly doped amorphous semiconductor 5, and the surface of the light incident side on the crystal semiconductor is not uneven. 23 is a characteristic of the first embodiment of a photovoltaic device according to the invention (FIG. 2), in which the single-crystalline semiconductor 3 is directly touched with the n-type amorphous semiconductor 5, the surface of the light incident side on the crystal semiconductor is formed uneven, and the photovoltaic device does not have an intrinsic amorphous semiconductor.

In FIG. 4, making a comparison of the photovoltaic device 22 with the photovoltaic device 23, the photovoltaic device 23 having the uneven surface of the light incident side of the single-crystalline semiconductor has a good characteristic of the photo-sensitivity in the wavelength region from 600 nm to 1200 nm compared to the photovoltaic device 22. However, the photovoltaic device 21 of the present invention is superior to the photovoltaic device 22 of the prior art on the characteristics of the photo-sensitivity in the long wavelength region.

In the photovoltaic device 21 of the present invention, the improvement of the characteristics of the photo-sensitivity is observed on the long wavelength region, keeping the same level of the characteristics of the photo-sensitivity in the wavelength region from short wavelength to long wavelength (about 800 nm) as the photovoltaic device 23 of the prior art. This characteristic of the photovoltaic device 21 should be paid attention to. Thus, the photovoltaic device 21 can efficiently pick up light as carriers which are absorbed in a deep portion of the light incident side.

Third Embodiment

Figures 5A, 5B:
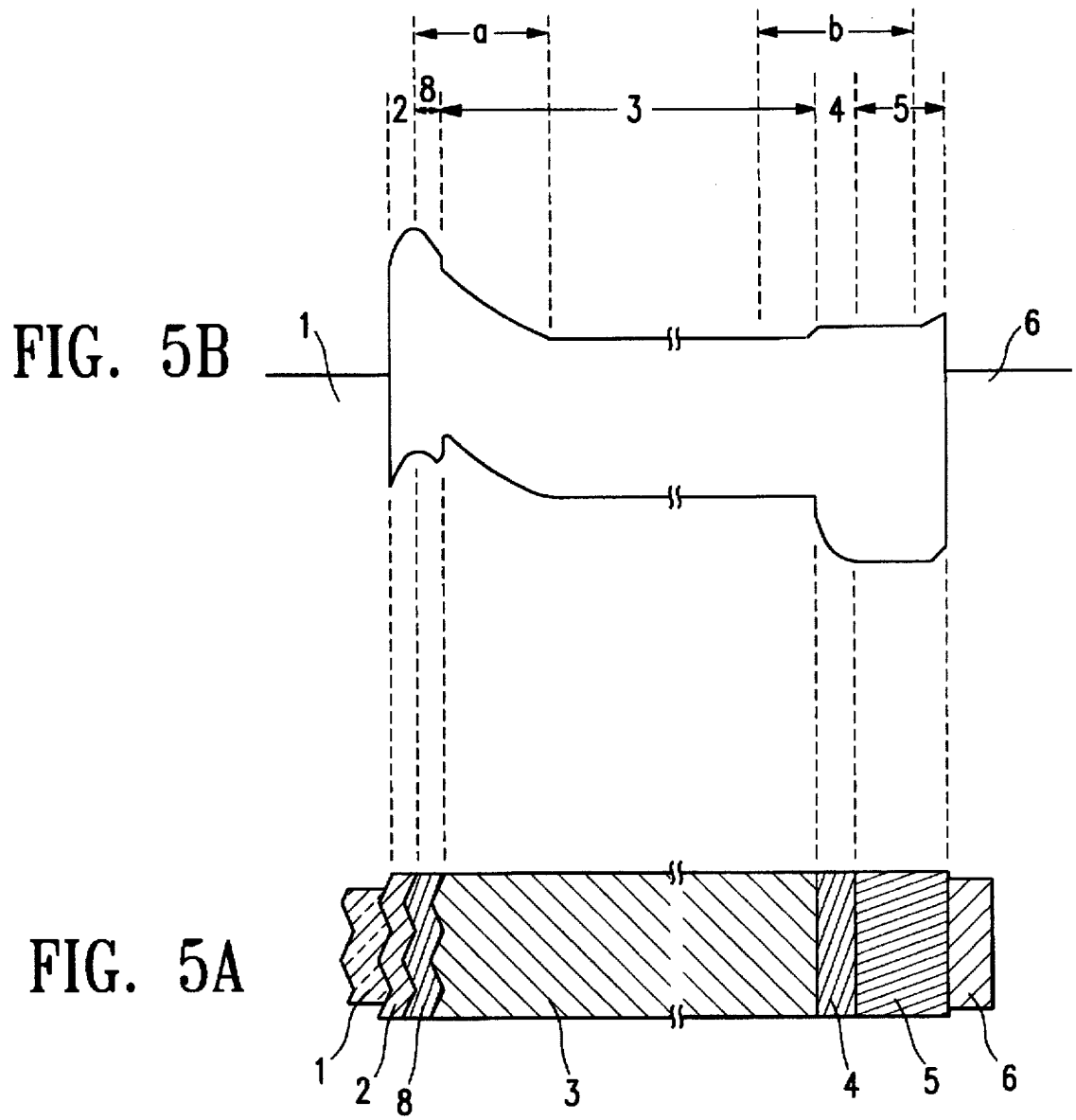
FIG. 5A is a side elevation view, in cross section, of a photovoltaic device in accordance with a third embodiment.
FIG. 5B is a band profile of the photovoltaic device shown in FIG. 5A.

In this third embodiment, to prevent from recombining of the photo-generated carrier on the interface state generated by the first semiconductor junction, the example having the intrinsic semiconductor between the p-type amorphous semiconductor 2 and the crystal semiconductor 3 is explained. FIG. 5A is the side elevation view of the photovoltaic device in accordance with the third embodiment, and FIG. 5B is the band profile of the photovoltaic device shown in FIG. 5A.

In FIG. 5, the same materials are expressed by the same numbers as in FIG. 3.

In FIG. 5A, the transparent electrode 1 is composed of ITO with the thickness 700 Å, and placed on the p-type a-Si layer with the thickness 40 Å. 3 is the n-type crystal semiconductor composed of the single-crystalline silicon with the thickness 300 µm having a resistivity of in the range from 1 Ωcm to 3 Ωcm. 8 is an amorphous i-type semiconductor composed of the intrinsic a-Si. Though the thickness of the intrinsic a-Si is 70 Å in this third embodiment, the thickness of the layer in the range from 30 Å to 120 Å can be used. Viewing from the light incident side of the photovoltaic device, the transparent electrode 1, the p-type a-Si layer 2, the amorphous i-type silicon layer 8 and the single crystalline silicon 3 are stacked by turn. The amorphous i-type silicon layer 8 is put between the p-type a-Si layer 2 and the single-crystalline silicon layer 3.

In addition to above structure, the intrinsic a-Si layer 4 (the intrinsic semiconductor layer) is formed on another side, which is an opposite side of the light incident side, of the single-crystalline silicon. Though, in this third embodiment, the thickness of the intrinsic a-Si layer 4 is 50 Å, the thickness of the layer in the range from 20 Å to 400 Å is available.

On another plane (compared to the light incidence plane), the n-type a-Si layer 5 with the thickness of 200 Å is formed on the intrinsic a-Si layer 4. The suitable thickness of the n-type a-Si layer is in the range from 50 Å to 1000 Å. And on the n-type a-Si layer 5, a metal back electrode is formed. The back electrode is 1 µm thickness and composed of aluminum.

The conversion efficiency of the photovoltaic device of the second embodiment reached to 18%.

Fourth Embodiment

In this fourth embodiment, as to the photovoltaic device obtained by the second embodiment shown in FIG. 3A, the thickness of the intrinsic a-Si 4 is changed, and the conversion efficiency is measured. On this photovoltaic device, the intrinsic a-Si 4 includes the hydrogen, and is put between the n-type single-crystalline silicon 3 (the crystal semiconductor) and the n-type a-Si 5 (the n-type amorphous semiconductor).

Figure 6:
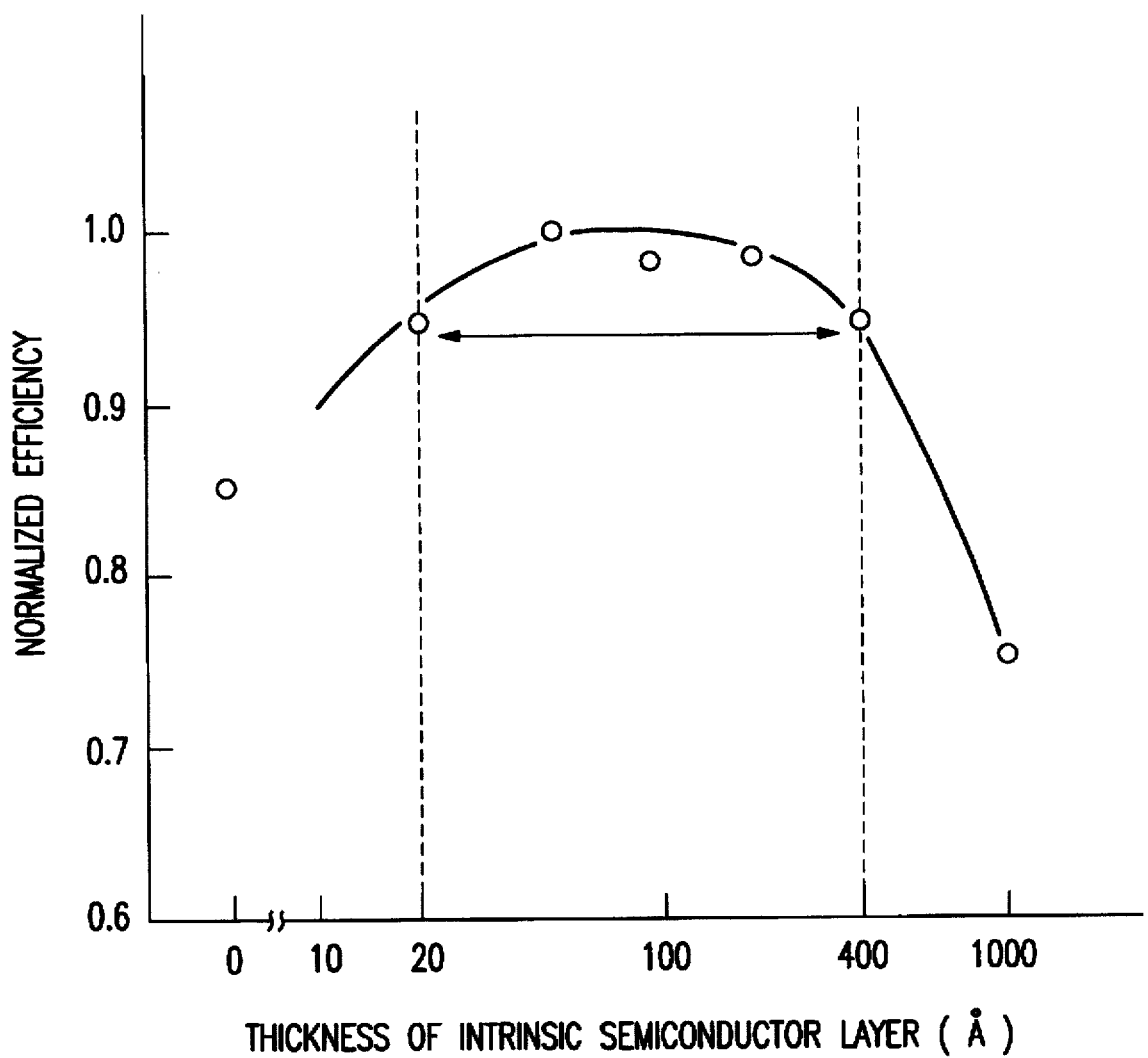
FIG. 6 is a graph showing the relationship between a thickness of the a-Si 4 and conversion efficiency in a photovoltaic device in accordance with a fourth embodiment of the invention.

The result of measuring is shown in FIG. 6. FIG. 6 is a graph showing the relationship between the thickness of the intrinsic a-Si 4 including the hydrogen and the conversion efficiency in this photovoltaic device. Based on this result, the thickness of the intrinsic a-Si is suitable in the range from 20 Å to 400 Å. And superior characteristics of the photovoltaic device is obtained on the thickness of 50 Å.

Fifth Embodiment

In the fifth embodiment, as to the photovoltaic device obtained by the first embodiment shown in FIG. 3A, the hydrogen content of the intrinsic a-Si 4 is changed, and the conversion efficiency is measured. On this photovoltaic device, the intrinsic a-Si 4 is put between the n-type single-crystalline silicon 1 and the n-type a-Si 5.

Figure 7:
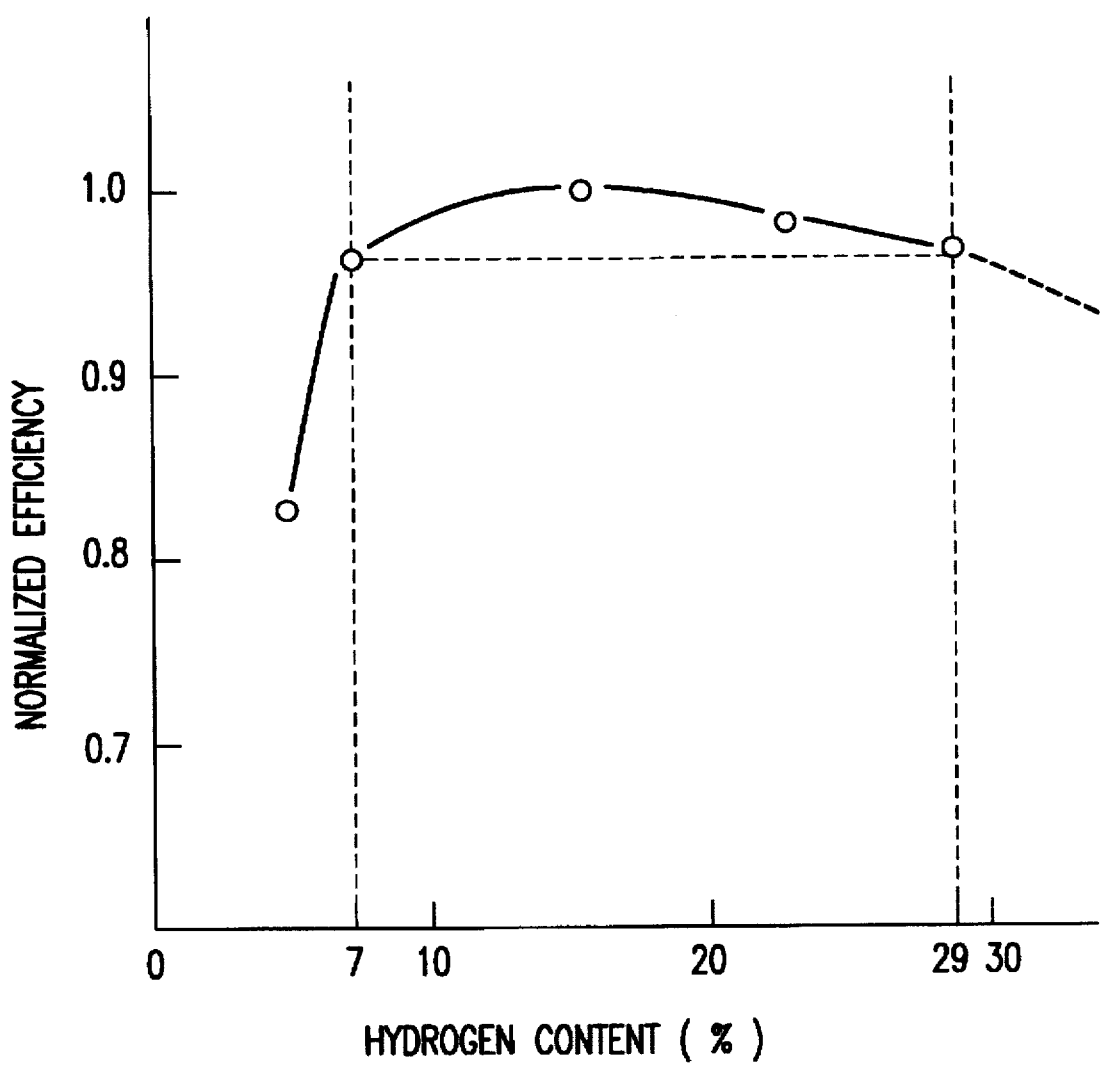
FIG. 7 is a graph showing the relationship between a hydrogen content of the a-Si 4 and conversion efficiency in a photovoltaic device in accordance with a fifth embodiment of the invention.

The result of measuring is shown in FIG. 7. FIG. 7 is a graph showing the relationship between the hydrogen content of the intrinsic a-Si 4 and the conversion efficiency in this photovoltaic device. Based on this result, the hydrogen content of the intrinsic a-Si is suitable in the range form 7 atm % to 29 atm %.

Sixth Embodiment

In the above second embodiment, the p-type semiconductor is used as the a-Si layer 2 of which the transparent electrode is formed on the light incident plane, and the n-type semiconductors are used as both the single-crystalline silicon 3 (the crystal semiconductor) and the a-Si layer 5 on another plane. On the other hand, in this sixth embodiment, the n-type semiconductor is used as the a-Si layer 12 of the light incident side, and the p-type semiconductors are used as the single-crystalline silicon 13 (the crystal semiconductor) and the a-Si layer 15 of another side. This structure of the photovoltaic device is shown in FIG. 8.

FIG. 8A is the side elevation view of this device. And FIG. 8B is the band profile of this photovoltaic device shown in the FIG. 8A, for explaining the internal electric field and function.

In this sixth embodiment, the thickness of the a-Si 12 touching the transparent electrode 1 is set 40 Å. The thickness of the a-Si 12 is suitable in the range from 30 Å to 100 Å in this sixth embodiment. And the intrinsic a-Si layer 14 is constructed like the second embodiment. In case of using the n-type a-Si layer of another side, the same thickness of this intrinsic a-Si layer 14 and the p-type a-Si 15 is suitable.

In addition, although the foregoing description of any of the embodiments is directed to the case when the single crystalline semiconductor is used as the crystal it is needless to say that the polycrystalline material such as the polycrystalline silicon, may be used.

As this invention may be embodied in several forms without departing from the spirit of essential characteristics thereof, the present embodiment is therefore illustrative and not restrictive, since the scope of the inventions defined by claims rather than by the description preceding them, and all changes that fall within the metes and bounds of the claims, or equivalence of such metes and bounds thereof are therefore intended to be embraced by the claims.

What is claimed is:

1. A photovoltaic device having a multilayer semiconductor structure which includes an n-i-n or p-i-p portion, said device comprising:

a transparent electrode, a back electrode and a plurality of semiconductor layers between said transparent electrode and said back electrode, wherein said plurality of semiconductor layers include:

a first amorphous semiconductor layer of a first conductivity type disposed adjacent said transparent electrode;

a crystalline semiconductor layer disposed for absorbing light which passes through said transparent electrode and said first semiconductor layer, said crystalline semiconductor layer having a second conductivity type which is opposite to said first conductivity type;

a first intrinsic amorphous semiconductor layer contacting, and forming an interface with, said crystalline semiconductor layer; and a second amorphous semiconductor layer of said second conductivity type contacting, and forming an interface with, said first intrinsic amorphous semiconductor layer at a location such that said first intrinsic amorphous semiconductor layer is sandwiched between said crystalline semiconductor layer and said second amorphous semiconductor layer, said second amorphous semiconductor layer being operatively associated with said back electrode for conducting photocurrent from said crystalline semiconductor layer to said back electrode.

2. A photovoltaic device as defined in claim 1 wherein said plurality of semiconductor layers further include a second intrinsic amorphous semiconductor layer disposed between said first amorphous semiconductor layer and said crystalline semiconductor layer.

3. A photovoltaic device as defined in claim 1 wherein said crystalline semiconductor layer has a surface which faces said first amorphous semiconductor layer and which is uneven.

4. A photovoltaic device as defined in claim 1 wherein said crystalline semiconductor is selected from the group of single-crystalline semiconductor and polycrystalline semiconductor.

5. A photovoltaic device as defined in claim 1 wherein said intrinsic amorphous semiconductor layer has a hydrogen content in a range from 7 atm % to 29 atom %.

6. A photovoltaic device as defined in claim 1 wherein said intrinsic amorphous semiconductor layer has a thickness of in the range from 20 Å to 400 Å.

7. A photovoltaic device comprising:

a transparent front electrode;

a first amorphous semiconductor layer of a first conductivity type laminated to said front electrode;

a crystalline semiconductor layer of a second conductivity type laminated to said first amorphous semiconductor layer and disposed for absorbing light which passes through said transparent electrode and said first semiconductor layer;

a second amorphous semiconductor layer of a second conductivity type which is opposite to said first conductivity type, laminated to said crystalline semiconductor layer; and a back electrode laminated to said second amorphous semiconductor layer, wherein said second amorphous semiconductor layer is operatively associated with said back electrode for conducting photocurrent from said crystalline semiconductor layer to said back electrode.

8. A photovoltaic device as defined in claim 7 wherein said crystalline semiconductor layer has a surface which faces said first amorphous semiconductor layer and which is uneven.

9. A photovoltaic device as defined in claim 7 wherein said crystalline semiconductor layer is made of a single-crystalline semiconductor material.

* * * * *